United States Patent
Cheung

(10) Patent No.: US 7,816,963 B1
(45) Date of Patent: Oct. 19, 2010

(54) PHASE INTERPOLATOR WITH ADAPTIVE DELAY ADJUSTMENT

(75) Inventor: Tszshing Cheung, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/828,779

(22) Filed: Jul. 1, 2010

Related U.S. Application Data

(62) Division of application No. 11/489,341, filed on Jul. 19, 2006, now Pat. No. 7,772,898.

(30) Foreign Application Priority Data

Dec. 28, 2005 (JP) .............................. 2005-379994

(51) Int. Cl.
H03L 7/06 (2006.01)
(52) U.S. Cl. ...................................... 327/158; 327/161
(58) Field of Classification Search .................. 327/20, 327/158, 161
See application file for complete search history.

(56) References Cited

U.S. PATENT DOCUMENTS

| 6,675,307 B1 | 1/2004 | Heitkamp et al. |
| 2001/0011893 A1 | 8/2001 | Walker |
| 2004/0170244 A1 | 9/2004 | Cranford et al. |

FOREIGN PATENT DOCUMENTS

| JP | 2-31518 | 2/1990 |
| JP | 6-224750 | 8/1994 |
| JP | 2000-99192 | 4/2000 |
| JP | 2001-68981 | 3/2001 |
| JP | 2001-217682 | 8/2001 |
| JP | 2004-282360 | 10/2004 |
| JP | 2005-286467 | 10/2005 |

OTHER PUBLICATIONS

Non-final Office Action dated Dec. 5, 2007 for corresponding U.S. Appl. No. 11/489,341.
Non-final Office Action dated Feb. 12, 2008 for corresponding U.S. Appl. No. 11/489,341.
Non-final Office Action dated Aug. 6, 2008 for corresponding U.S. Appl. No. 11/489,341.
Final Office Action dated Jan. 14, 2009 for corresponding U.S. Appl. No. 11/489,341.
Non-final Office Action dated Jun. 15, 2009 for corresponding U.S. Appl. No. 11/489,341.
Final Office Action dated Nov. 24, 2009 for corresponding U.S. Appl. No. 11/489,341.
Notice of Rejection Grounds dated Nov. 24, 2009 for corresponding Japanese Application No. 2005-379994.

*Primary Examiner*—Lincoln Donovan
*Assistant Examiner*—Daniel Rojas
(74) *Attorney, Agent, or Firm*—Katten Muchin Rosenman LLP

(57) ABSTRACT

The phase interpolator includes two adjustable delays 30 and 31, phase comparator 32 which detects a phase difference between a signal delayed by the adjustable delay 30 and a signal delayed by the adjustable delay 31, an integrator 33 which integrates the outputs of the phase comparator 32 and multipliers 34-1 and 34-2 which set a control voltage for the adjustable delays 30 and 31. The feedback loop comprising phase comparator 32 and integrator 33 controls a delay amount of the adjustable delay 30 thereby securing a phase relation between {ACK1, ACK2} and ICK to achieve a stable ICK phase.

1 Claim, 16 Drawing Sheets

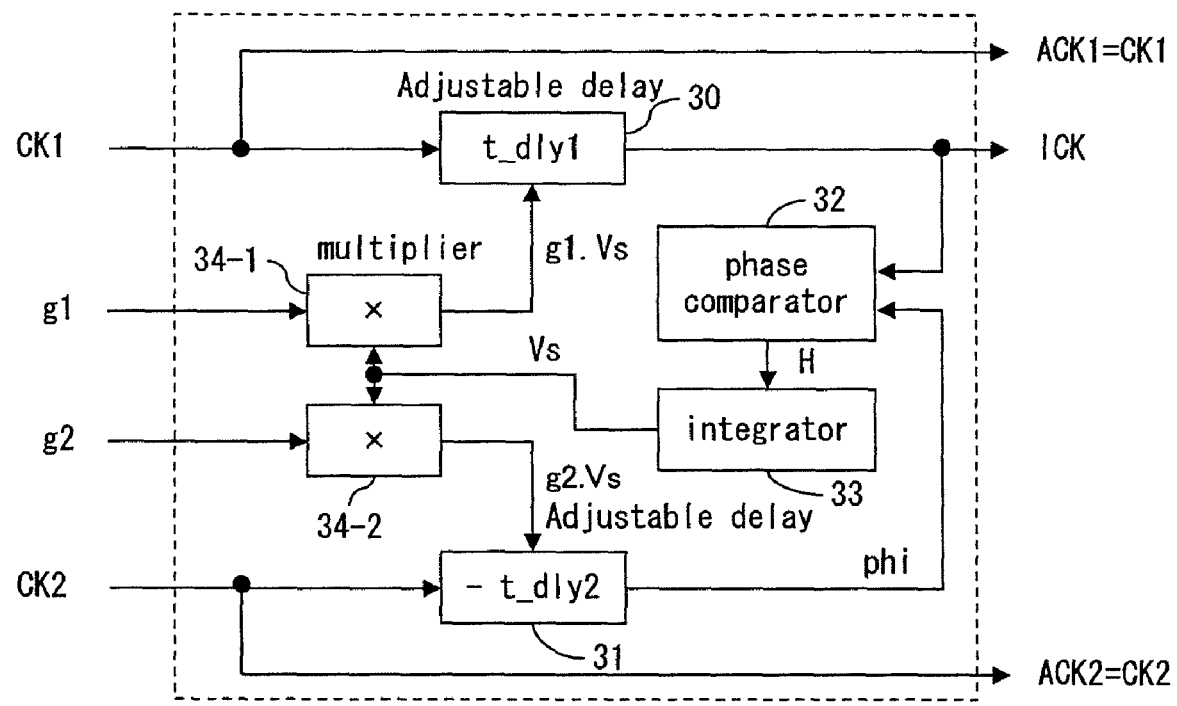
F I G. 4 A

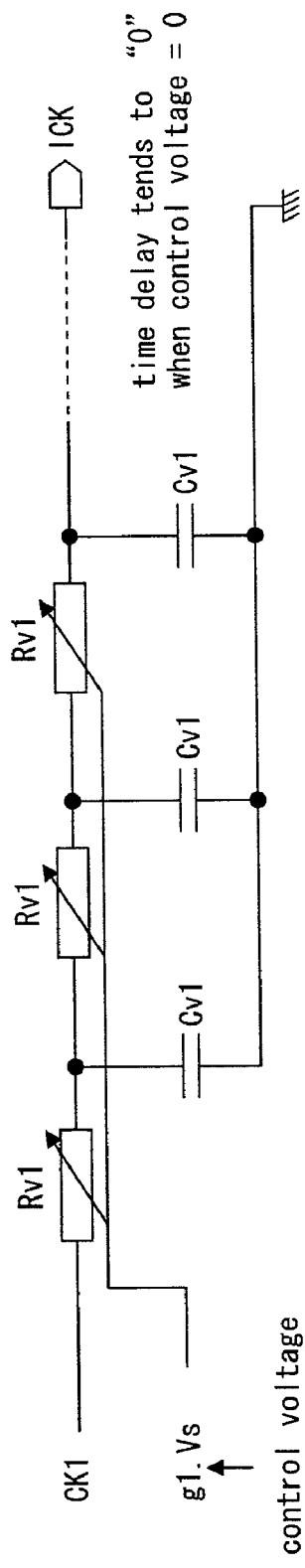
F I G. 8A
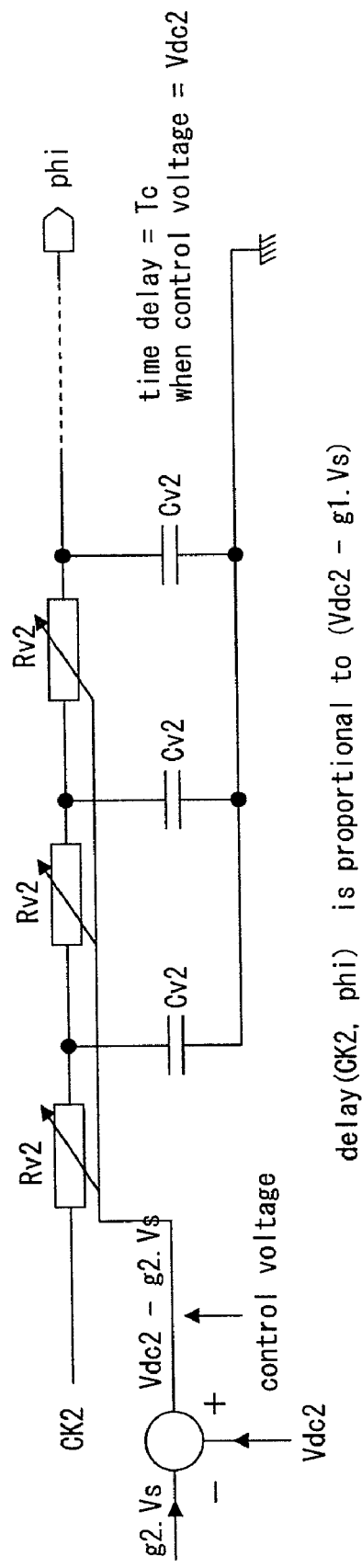
F I G. 8B

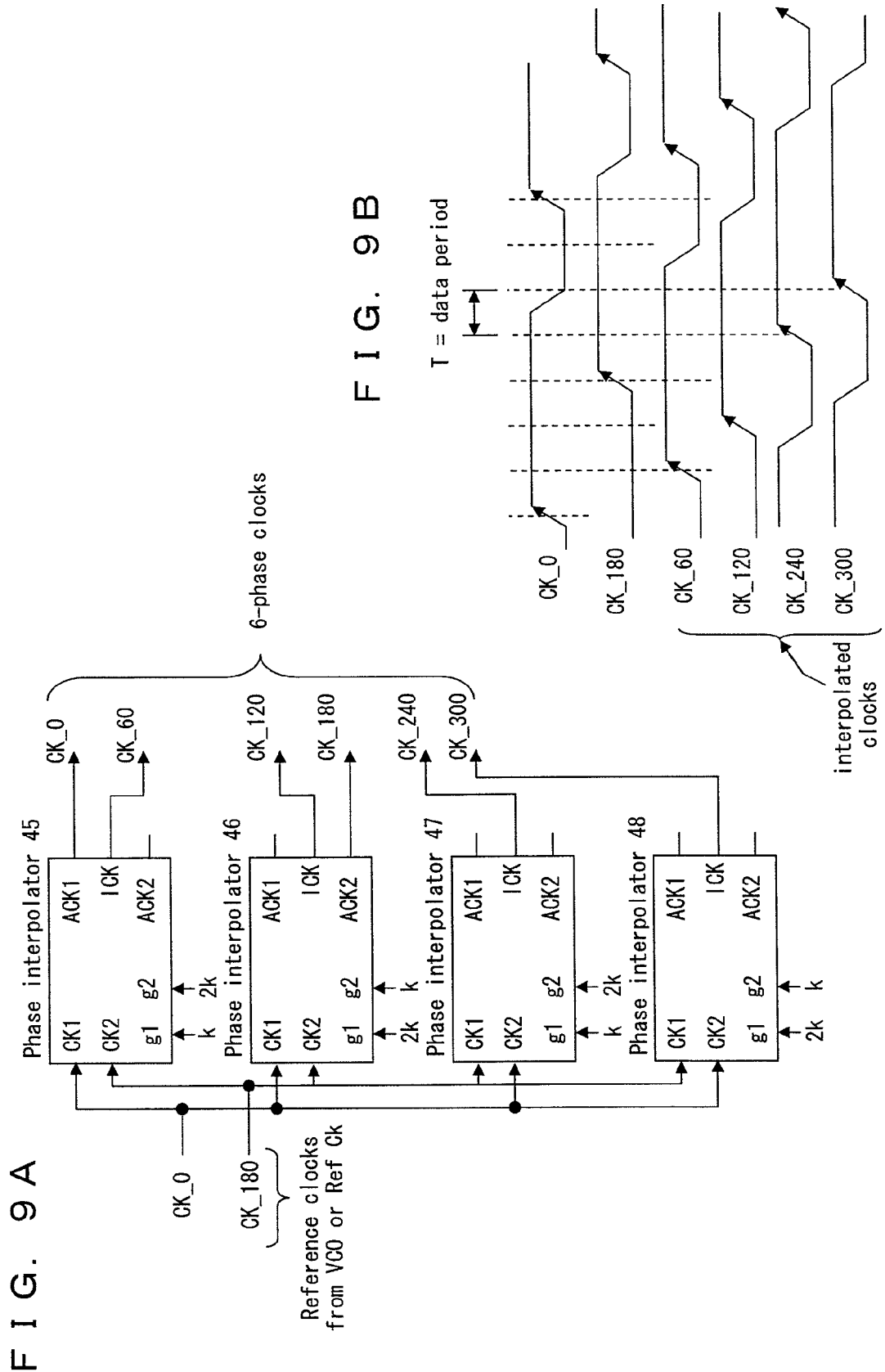

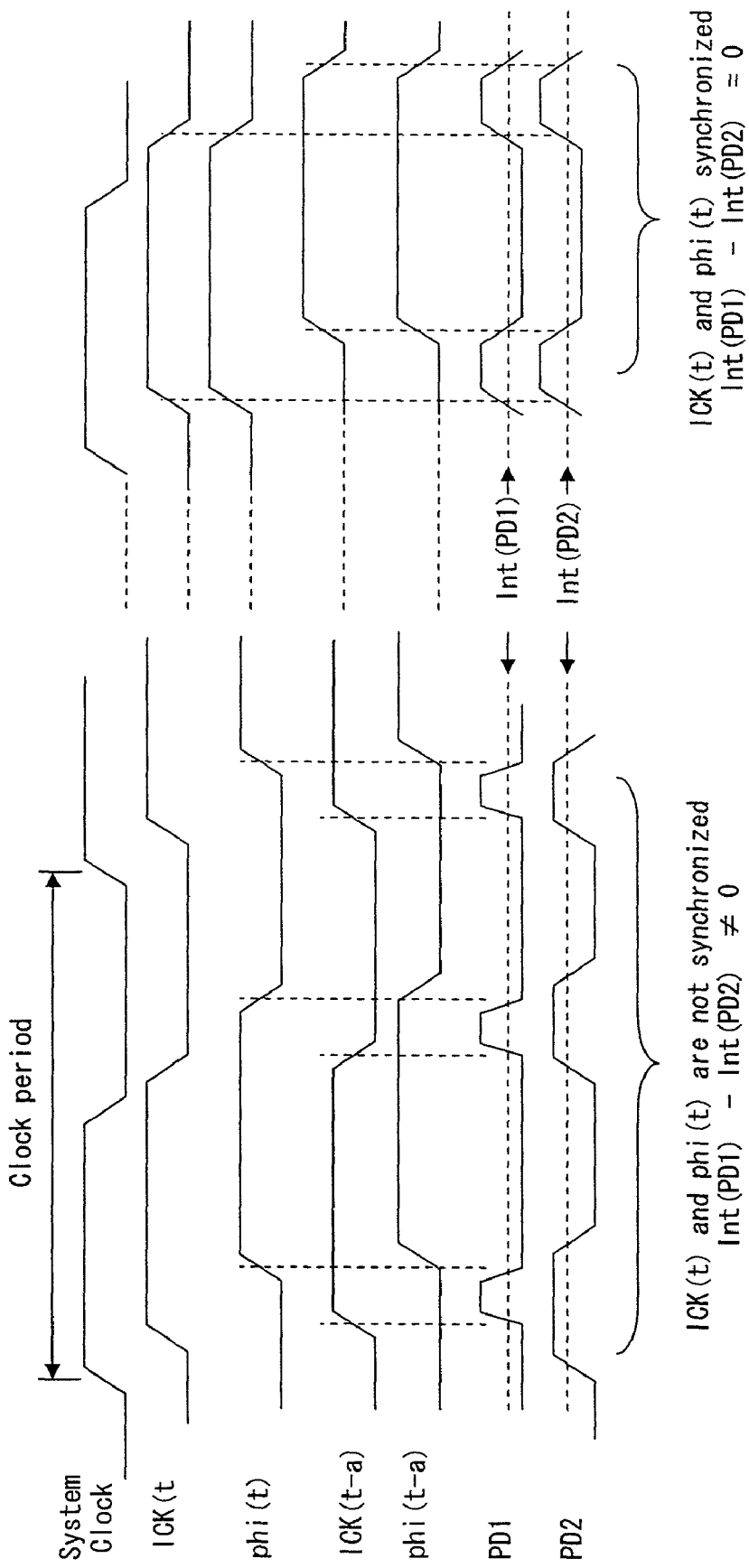

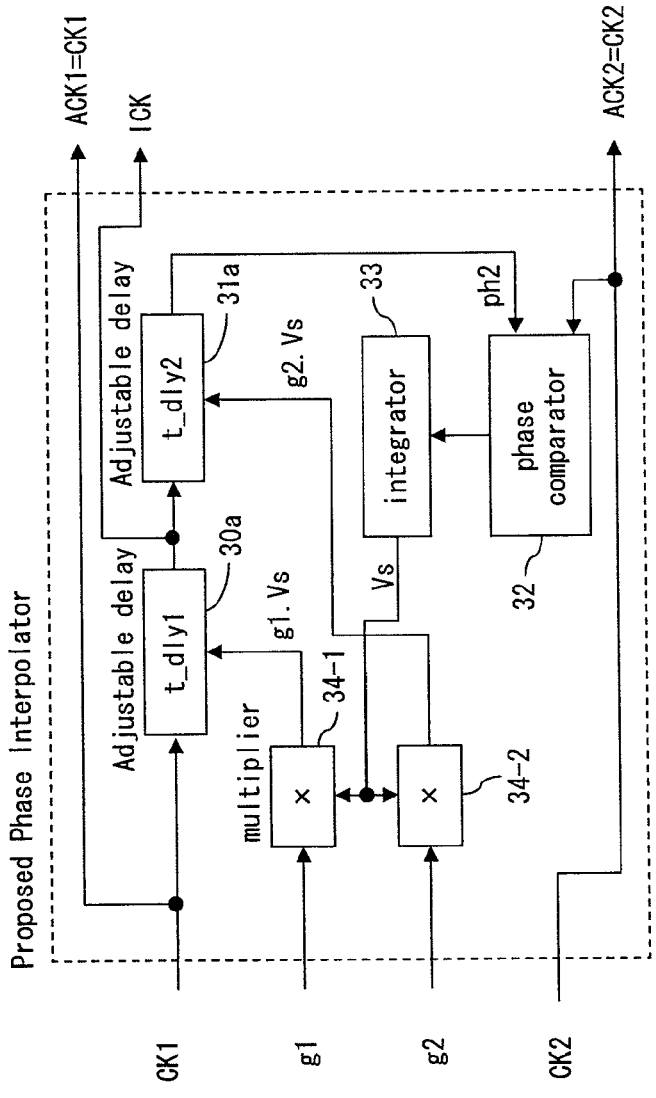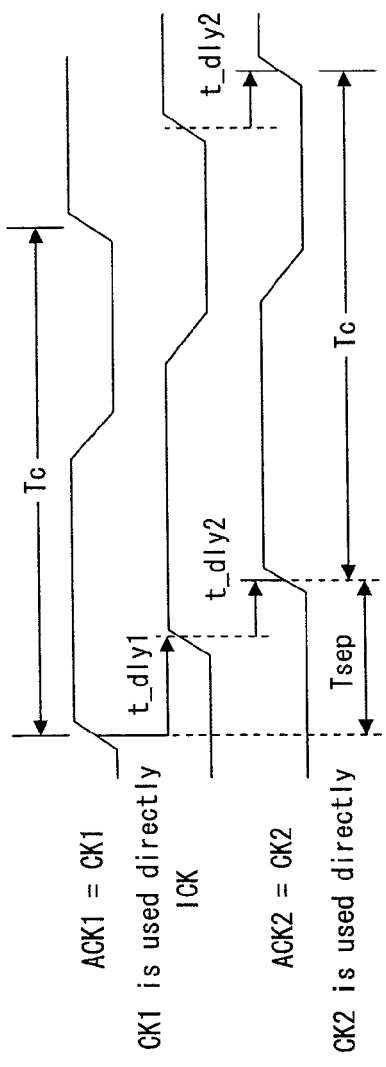
FIG. 13A
FIG. 13B

PHASE INTERPOLATOR WITH ADAPTIVE DELAY ADJUSTMENT

BACKGROUND OF THE INVENTION

1. Field of the Invention

The present invention relates to a phase interpolator, particularly, that of a Clock Data Recovery (CDR) system.

2. Description of the Related Arts

Phase interpolators are widely used to adjust phase differences among system clocks in Clock Data Recovery (CDR) systems and phase detection systems, in which accurate interleaving clocks are required for the front-end samplers to latch the input data.

Conventional phase interpolators (PI) use analog elements (adder, multiplier or mixer, amplifier, etc.) to adjust a phase difference between two reference clock(s). Since time delays exist in those analog elements, delay compensation elements are necessary to adjust phase among reference clocks and interpolated clock. Moreover, there are different kinds of time jitter and variation in delay compensation elements. The time delays of such elements are also sensitive to change in incoming data rate, process parameters and temperature.

FIG. 1 shows an example of a conventional clock data recovery system.

In the example of a clock data recovery (CDR) system shown in FIG. 1, there are parallel front-end samplers 10-1, 10-2, 10-3, . . . , 10-n, a demultiplexer (DEMUX) 11, a phase detect unit 12, 2 non-linearity correction coders 13-1 and 13-2, delay compensation elements (t_dly) 14-1 and 14-2, a phase interpolator 15 and a charge pump 16. Input data Din is serial data and the input data Din is latched by samplers 10-1, 10-2, 10-3, . . . , 10-n in parallel. The samplers 10-1, 10-2, 10-3, . . . , 10-n are latches or flip-flops for example. Each sampler 10-1, 10-2, 10-3, . . . , 10-n latches data at different timing, which means the input data Din is transformed from serial data to parallel data. When n samplers are provided the input data Din is converted to n parallel data. The parallelized input data Q's are input to the demultiplexer 11 where the parallelized input data are synchronized with each other and output as output data Dout which is parallel data. The demultiplexer 11 detects phase information of the parallelized input data Q's and outputs it to the phase detect unit 12. The phase detect unit 12 outputs signals which represent differences in phases between the parallelized input data Q's. The output signals from the phase detect unit 12 are fed to the charge pump 16 and the non-linearity correction coder 13-1 and 13-2. The charge pump 16 converts the output of the phase detect unit 12 to a control voltage for a VCO (voltage controlled oscillator) which generates reference clock signals (CK1 and CK2) for operation of the data recovery system. By changing the control voltage the phases or frequencies of the reference clock signals (CK1 and CK2) can be changed. The outputs of the phase detect unit 12 which are input to the non-linearity correction coder 13-1 and 13-2 are converted to delay amount control voltages for delay compensation elements 14-1 and 14-2 and weight coefficients (g1 and g2) for the phase interpolator 15. The non-linearity correction coder 13-1 and 13-2 are composed of lookup tables, for example, which convert outputs of the phase detect unit 12 to suitable voltage signals for delay compensation elements 14-1 and 14-2 and weight coefficients g1 and g2 for the phase interpolator 15. The reference clock signals CK1 and CK2 are delayed by the delay compensation elements 14-1 and 14-2 to be clock signals ACK1 and ACK2 for samplers 10-1 and 10-3, respectively, for example. The phase interpolator 15 receives the reference clocks CK1 and CK2 and weight coefficients g1 and g2 in order to make an interpolated clock signal ICK depending on values of weight coefficients g1 and g2. The interpolated clock signal ICK is used to latch data of intermediate timing between those of ACK1 and ACK2. If the number of Q's is three only one phase interpolator is provided but if the number of Q's is more than three a plurality of phase interpolators are provided.

FIG. 2 is a timing chart of the conventional data recovery system shown in FIG. 1.

There are phase errors between ICK and reference clocks (CK1, CK2) in conventional phase interpolators. If phase error occurs erroneous data will exist in the output of the data recovery system.

In FIG. 2, the input data Din is shown as signals with data period T. The signal ACK1 is used to latch data at timing (1) for each n data period. Also the signal ACK2 is used to latch data at timing (2) for each n data period. And the signal ICK is used to latch data at timing (3) for each n data period. Here only three signals for latching are shown. However, in order to latch n data at different timing (n−3) more signals for latching are needed. We focus on only three signals ACK1, ACK2 and ICK, which is enough to understand the problems of the conventional phase interpolator.

As indicated as "unstable phases" in FIG. 2, the phase shift of ACK1, ACK2 and ICK occurs in the conventional phase interpolator. This phase shift causes erroneous data occurrence in parallelized input data Q's. Therefore, synchronized data Dout which is generated from the parallelized input data Q's includes erroneous data. In FIG. 2 only one figure is shown for Dout because as Dout has synchronized n data sequences it is space saving to represent n bits in one data period. Therefore, the data period (4) of Dout represents n parallel bit data and the data period (5) represents n parallel bit data with erroneous data.

FIGS. 3A and 3B show a conventional phase interpolator used in the conventional clock data recovery system shown in FIG. 1.

As shown in FIG. 3A, the conventional phase interpolator comprises multipliers 20-1 and 20-2, an analog adder 21 and an amplifier 22. The signal CK1 is multiplied by g1 by multiplier 20-1 and the signal CK2 is multiplied by g2 by multiplier 20-2. The outputs from multiplier 20-1 and 20-2 are input to the analog adder 21 and the outputs are added. As explained below the intermediate phase signal is generated by adding the outputs of multiplier 20-1 and 20-2. The amplifier 22 amplifies the output of the analog adder 21 in order to make the amplitude of the intermediate signal suitable for the signal ICK.

Because analog elements (analog adder 21, multiplier 20-1 and 20-2, amplifier 22) are used, delay in a phase of ICK occurs due to inherent operation delay of these analog elements. In order to adjust phases of two reference clocks CK1 and CK2 with respect to the phase of ICK so that proper latch operation can be performed, the signals ACK1 and ACK2 are generated from the signals CK1 and CK2 by delaying these signals.

Since time delays exist in those analog elements, delay compensation elements 14-1 and 14-2 are necessary to adjust phase among reference clocks CK1 and CK2 and interpolated clock ICK. The delay time occurred in a conventional phase interpolator is denoted by "t_dly". To compensate for the delay time (t_dly), both CK1 and CK2 are delayed to generate ACK1 and ACK2.

Mathematically, t_dly≈time delay between CK1 and ICK≈time delay between CK2 and ICK.

In FIG. 3B, the reference clocks CK1 and CK2 are shown as signals with period Tc. The signals CK1 and CK2 are phase-shifted with respect to each other. The interpolated signal shown as a desired output by the dotted line is required. But the output of the analog adder AD and the output of the amplifier ICK (real output) are delayed from the desired output by t_dly. In order to match the phases between CK1, CK2 and ICK the phases of CK1 and CK2 should be delayed. Therefore, the signals ACK1 and ACK2 respectively delayed from CK1 and CK2 by t_dly are generated.

However, phase mismatch occurs because t_dly varies with values of g1, g2, and operating conditions.

Worse, since the phase difference between CK1 and ICK is a non-linear function of {g1,g2}, the non-linearity correction coders are necessary in the conventional clock data recovery system.

Addition of these non-linearity decoders increases the complexity and circuit scale of the clock data recovery system. Due to the large scale of the circuit and time delays in each circuit block, the phase error cannot be compensated immediately. As a result, there will be erroneous data in the recovered data. This will result in errors in the demultiplexed data.

The following is a description of the relation of {g1,g2} and the phase difference between CK1 and ICK.

In a conventional phase interpolator, ICK can be considered as a shaped waveform of (g1·CK1+g2·CK2). The weights g1 and g2 adjust the proportion of likeness to {CK1, CK2}. When g1 is larger than g2, the interpolated ICK is more similar to CK1 than to CK2, and when g2 is larger than g1, the interpolated ICK is more similar to CK2 than CK1. If both of CK1 and CK2 are sinusoidal waves, refer to the equation (1) and equation (2) below. If CK1 and CK2 are triangular waves or square waves, the interpolated clock is a summation of all the sinusoidal harmonics of the g1·CK1 and g2·CK2.

Below is an explanation in the case of a sinusoidal wave being used to describe a waveforms phase in a conventional phase interpolator. Details of calculation are described as follows.

If both of CK1 and CK2 are sinusoidal waves, they can be expressed as CK1=sin(wt) and CK2=sin(wt−k), where w is the angular frequency of clocks (CK1 and CK2), t is time, and k is the phase difference between CK1 and CK2.

As a result, the waveform expression of AD in FIG. 3B is given by $$AD(t) = g1 \cdot \sin(wt) + g2 \cdot \sin(wt - k) \qquad \text{equation (1)}$$
$$= g1 \cdot \sin(wt) + g2 \cdot [\sin(wt)\cos(k) - \sin(k)\cos(wt)]$$
$$= [g1 + g2 \cdot \cos(k)]\sin(wt) - g2 \cdot \sin(k)\cos(wt)$$

Since the crossing point of AD(t) is defined as AD(t)=0, the corresponding value of wt is given by $$wt = \arctan[g2 \cdot \sin(k)/(g1 + g2 \cdot \cos(k))] \qquad \text{equation (2)}$$

In other words, AD and thus ICK are waveforms with a phase shift from CK1 of a value expressed by equation (2).

It is noted that the value in equation (2) is a non-linear function of each of g1, g2 and k.

If CK1 and CK2 are triangular waves or square waves, the interpolated clock is a summation of all the sinusoidal harmonics of the g1·CK1 and g2·CK2.

Mathematically, $$AD(t) = g1 \cdot E(\text{sinusoidal harmonics of } CK1) + g2 \cdot E(\text{sinusoidal harmonics of } CK2) \qquad \text{equation (3)}$$

which is also a function of g1, g2 and the phase difference between CK1 and CK2. As a result, the phases of AD and ICK vary when any of the values of g1, g2, or k changes.

In the conventional phase interpolator, an interpolated signal is generated by analog elements which have inherent operational delay and this delay is directly reflected in the phase delay of the interpolated signal. Therefore, in order to secure phase matching between reference signals and the interpolated signal, the phase delays of the reference signals and the interpolated signal have to be controlled. The control of the phase delays of the reference signals and the interpolated signal requires additional circuits. Therefore, a clock data recovery system or the like using the phase interpolator becomes bigger and more complex while instability of phase relations between the reference signals and the interpolated signal remains.

SUMMARY OF THE INVENTION

An object of the present invention is to provide a phase interpolator which secures phase relations between the reference signals and the interpolated signal and can be applied to realize devices with a smaller and simpler configuration.

The object of the present invention is achieved by providing the phase interpolator described below.

The first phase interpolator according to the present invention is a phase interpolator comprising: a first adjustable delay unit delaying a first reference clock signal to generate an interpolated clock signal with variable delay amount; a second adjustable delay unit delaying a second reference clock signal which has different phase from the first reference clock signal to generate a signal for comparison with variable delay amount; a phase comparator unit comparing phase of the interpolated clock signal and the signal for comparison and outputting a comparison result signal; and a delay amount control unit controlling the delay amount of the first adjustable delay unit and the second adjustable delay unit based on the comparison result signal to decrease phase difference between the interpolated clock signal and the signal for comparison.

The second phase interpolator according to the present invention is a phase interpolator comprising: a first adjustable delay unit delaying a first reference clock signal to generate an interpolated clock signal with variable delay amount; a second adjustable delay unit delaying the interpolated clock signal to generate a signal for comparison with variable delay amount; a phase comparator unit comparing a phase of a second reference clock signal, which has a different phase from the first reference clock signal, and the signal for comparison, and outputting a comparison result signal; and a delay amount control unit controlling the delay amount of the first adjustable delay unit and the second adjustable delay unit based on the comparison result signal to decrease the phase difference between the second reference clock signal and the signal for comparison.

According to the present invention, the phase relations between the reference signals and the interpolated signal are secured by a feedback loop in the phase interpolator. Therefore, there is no need to provide additional circuits which compensate phase mismatch between the reference signals and the interpolated signal when configuring devices using the phase interpolator.

As a result, the present invention can provide the phase interpolator which can be applied to realize devices of smaller and simpler configuration.

BRIEF DESCRIPTION OF THE DRAWINGS

FIG. 4A shows a phase interpolator according to an embodiment of the present invention (1).

FIGS. 8A and 8B show a second example of the voltage controlled time delay.

FIGS. 9A and 9B show an example of application of the phase interpolator of the present invention to a multi-phase clock generator.

FIGS. 12A and 12B show a timing chart of the phase interpolator in FIG. 11.

FIGS. 13A and 13B show another embodiment of the phase interpolator of the present invention.

DESCRIPTION OF THE PREFERRED EMBODIMENTS

The phase interpolator of the present invention may be embedded in an integrated circuit or be built from discrete elements. The phase interpolator of the present invention is also applicable to a phase locked loop or feedback system in which periodic clocks and/or signals are used to synchronize input data. It can also be used to synchronize system clocks in remote parts of a logic or digital system.

Delay time (t_dly) exists in the interpolated clock (ICK) generated by a conventional phase interpolator. To compensate for such a delay time, both of input reference clocks (CK1, CK2) are delayed to generate adjusted clocks (ACK1, ACK2). However, phase mismatch occurs because t_dly varies with ICK's phase and operating conditions.

The phase interpolator of the present invention produces an ICK which has stable phase relations with input reference clocks (CK1, CK2).

In the phase interpolator of the present invention, ICK are adjusted by a feedback loop such that the phases among ICK and reference clocks (CK1, CK2) are accurately aligned and are finely adjusted. Moreover, design of the CDR system using the phase interpolator of the present invention can be simplified because the interleaved clocks can be used directly from the phase interpolator, without using complicated compensation and coding circuits.

Figure 4B:
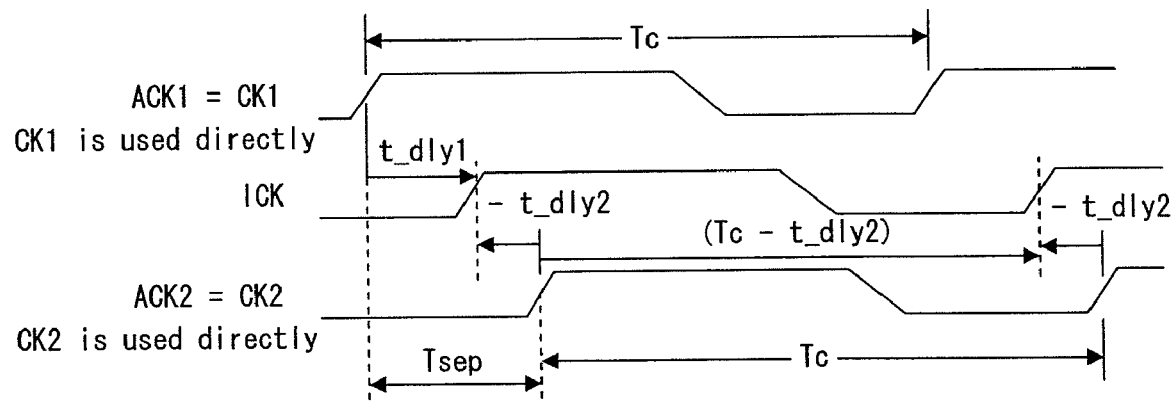
FIG. 4B shows a phase interpolator according to an embodiment of the present invention (2).

FIG. 4A and FIG. 4B show a phase interpolator according to an embodiment of the present invention.

As shown in FIG. 4A, the phase interpolator of the present invention uses two adjustable delay blocks 30 and 31 to generate ICK. These two adjustable delay blocks 30 and 31, a phase comparator 32 and an integrator 33 form a feedback loop which automatically adjust the phase between input and output clocks. The phases among (CK1, CK2) and ICK are monitored by a feedback loop, which maintains (t_dly2/t_dly1)=(g2/g1).

The adjustable delay 30 is used to shift CK1 with a delay (t_dly1), while the adjustable delay 31 is used to shift CK2 with a delay (Tc−t_dly2), where Tc is the cyclic time period of CK2. Note that a time delay of (Tc−t_dly2), is equivalent to delaying by (−t_dly2)(advancing by t_dly2) when CK1 and CK2 are periodic with a cyclic time period Tc. On the other hand, t_dly1 and t_dly2 are set to keep t_dly1+t_dly2=Tsep.

The delayed clocks delayed by the adjustable delay 30 and 31 are named ICK and phi, respectively. Phase between ICK and phi is monitored by a phase comparator 32 and an integrator 33. The phase comparator 32 outputs a phase difference between ICK and phi as a signal, "H". The integrator 33 integrates the signal indicating the phase difference between ICK and phi outputting voltage Vs, the value of which varies depending on the phase difference. The value Vs, which is proportional to the phase difference between ICK and phi, is generated and fed back to control t_dly1 and −t_dly2. Hence, ICK and phi are shifted gradually until their phase difference becomes zero. At the point where ICK and phi match, ICK becomes the desired output (the interpolated clock).

In the phase interpolator of the present invention, the function of g1 and g2 is to adjust ICK such that eventually $$t\_dly1 = \frac{(Tsep \cdot g1)}{(g1 + g2)},$$

where Tsep is defined as the timing difference between CK1 and CK2.

And (t_dly2/t_dly1)=(g2/g1).

As a whole, there is a feedback loop which controls the two adjustable delay elements in the phase interpolator of the embodiment of the present invention. While phase between ICK and phi tends to zero, Vs becomes stable and t_dly1 becomes equal to the above value.

In the configuration of FIG. 4A, there is delay according to inherent characteristics of multiplier 34-1 and 34-2, integrator 33 and phase comparator 32. However, this delay affects only the timing of changing delay amount of adjustable delay 30 and 31 and so does not affect the phase of ICK itself. As a result, there is no phase instability of ACK1, ACK2 and ICK like the conventional phase interpolator.

In the timing chart of FIG. 4B, CK1 is used directly as ACK1, CK2 is used directly as ACK2 and ICK is delayed from ACK1 by t_dly1 and delayed from ACK2 by −t_dly2 or delayed from ACK2 by Tc−t dly2. ICK and phi are shifted by t_dly1 and −t_dly2, respectively, and the phase between ICK and phi become closer and closer until they are completely matched. At this moment, the phase comparator will output a constant value such that Vs is stabilized. Since there is no phase error or incorrect phase shift between ACK1, ACK2 and ICK at this moment, the values of input (g1, g2) can be fixed. At this moment, the phase comparator produces an output whose DC value keeps Vs constant (This value is proportional to the phase difference between ICK and phi).

Figure 4C:
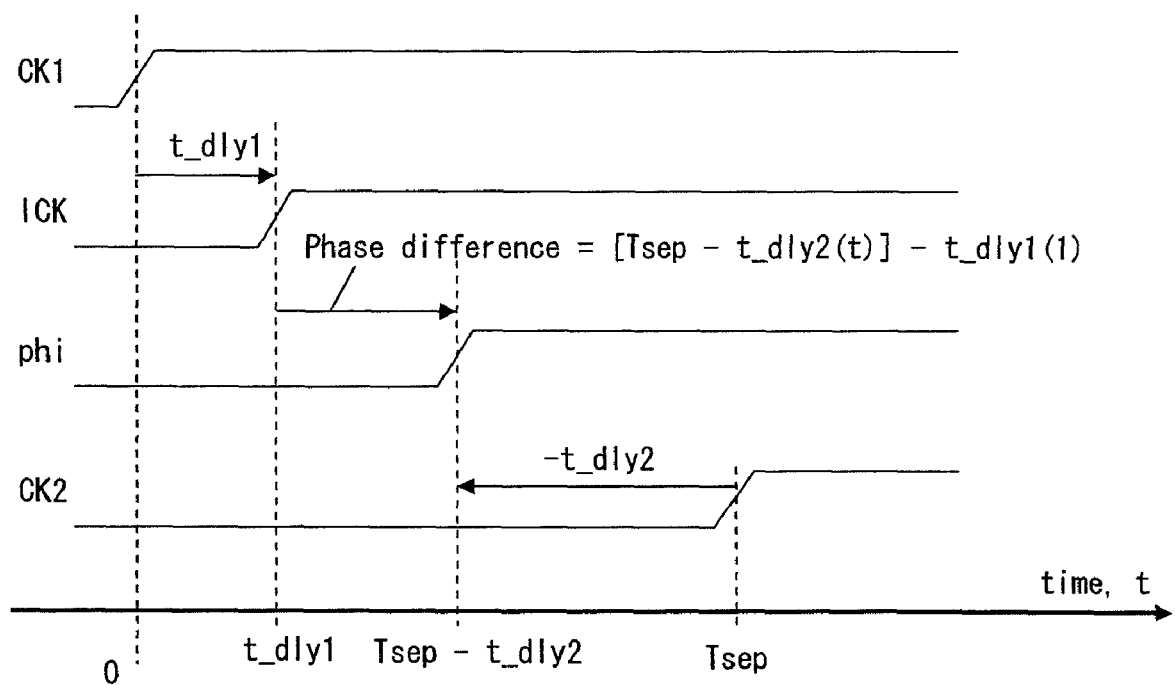
FIG. 4C shows behavior of t_dly1 and t_dly 2 as a function of time t (1).
Figure 4D:
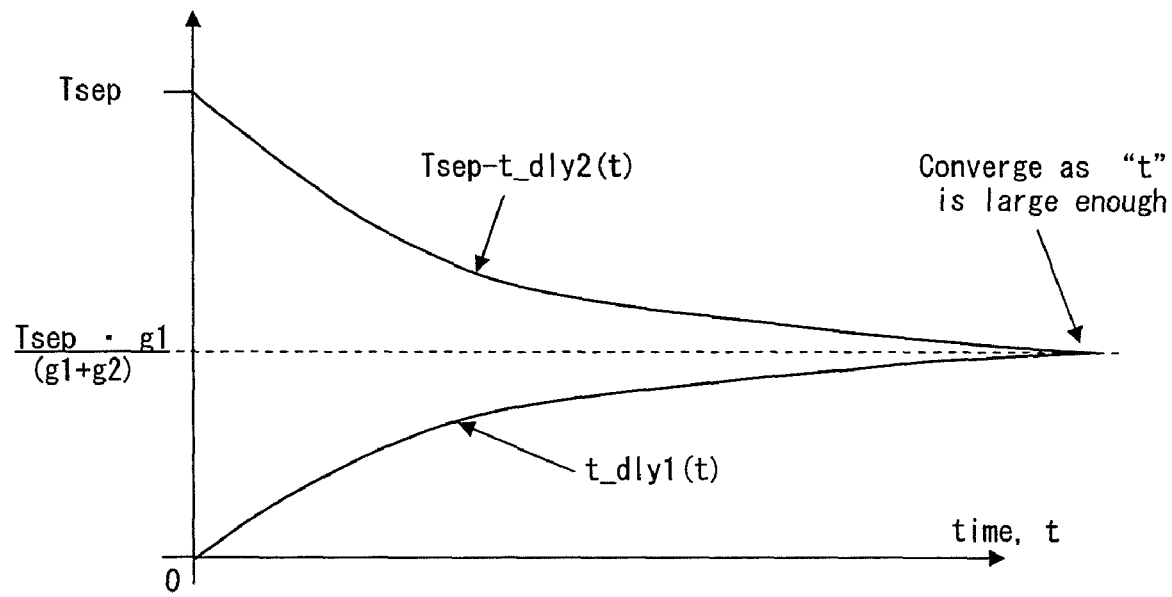
FIG. 4D shows behavior of t_dly1 and t_dly 2 as a function of time t (2).

FIG. 4C and FIG. 4D show behavior of t_dly1 and t_dly 2 as a function of time t.

As shown in FIG. 4C, relations among CK1, CK2, ICK and phi are expressed on a time axis defining a rising edge of CK1 as time, t=0. Then, H(t), output of the phase comparator, is proportional to the phase difference between ICK and phi and is expressed as $$H(t) = Ki \cdot \{[Tsep - t\_dly2(t)] - t\_dly1(t)\}$$
$$= Ki \cdot [Tsep - t\_dly2(t) - t\_dly1(t)]$$

The time function expressions of t_dly1 and t_dly2 are as follows:

$$t\_dly1(t) = Kd \cdot g1 \cdot Vs(t) \qquad \text{equation (4)}$$
$$= Kd \cdot g1 \cdot \int_0^t H(t) dt$$
$$= Kd \cdot g1 \cdot Ki \cdot \int_0^t [Tsep - t\_dly2(t) - t\_dly1(t)] dt,$$

where Kd=gain of the adjustable delay 30, and
Ki=gain of the integrator 33.
By setting the adjustable delay 31 with gain, Kd, $$t\_dly1(t)/t\_dly2(t) = g1/g2 \qquad \text{equation (5)}$$

Then, by merging equation (4) and (5), $$t\_dly1(t) = Kd \cdot g1 \cdot ki \cdot \int_0^t [Tsep - (1 + g2/g1)t\_dly1(t)] dt \qquad \text{equation (6)}$$

A typical solution of t_dly1(t) in equation (6) is given by:

$$t\_dly1(t) = \frac{(Tsep \cdot g1)}{(g1 + g2)}(1 - e^{-t/M}), \qquad \text{equation (7)}$$

where M=Kd·Ki·(g1+g2)
As time "t" is large enough, or as "M" is small enough, or both conditions are satisfied, $$t\_dly1(t) \text{ tends to } t\_dly1(t) = \frac{(Tsep \cdot g1)}{(g1 + g2)}(1 - 0) = \frac{Tsep \cdot g1}{(g1 + g2)} \qquad \text{equation (8)}$$

Since relation between t_dly2(t) and t_dly1(t) is given by equation (5), typical solution of t_dly2(t) is given by $$t\_dly2(t) = \frac{(Tsep \cdot g2)}{(g1 + g2)}(1 - e^{-t/M}) \qquad \text{equation (9)}$$

A typical trend of t_dly1, t_dly2 is shown in FIG. 4D. As time "t" is large enough, or as "M" is small enough, or both conditions are satisfied, both of t_dly1(t) and (Tsep−t_dly2(t)) converge to a constant value, namely, (Tsep.g1)/(g1+g2).

Figures 5A, 5B:
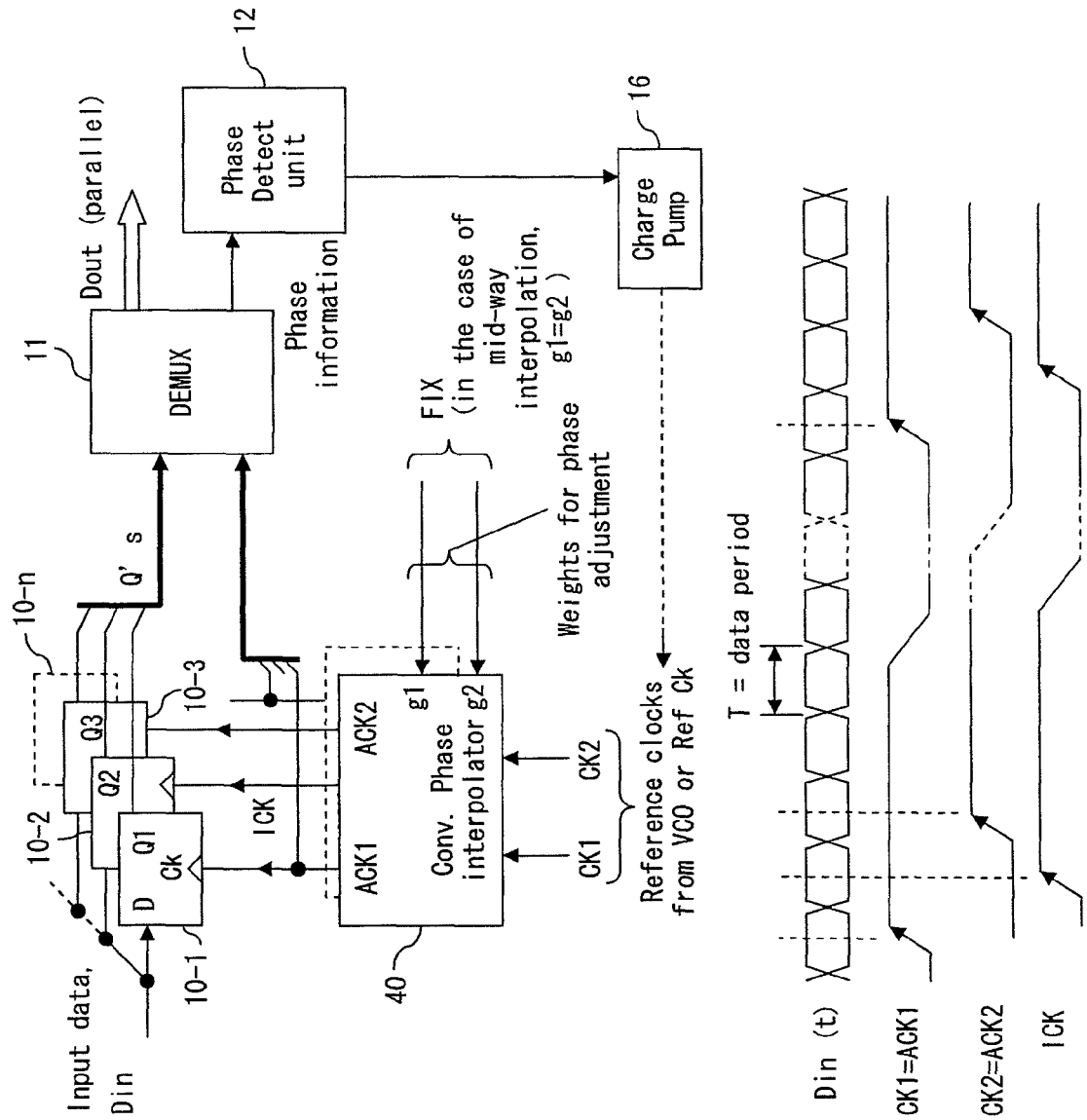
FIGS. 5A and 5B show an application of the phase interpolator of the embodiment of the present invention to the clock data recovery (CDR) system.

FIGS. 5A and 5B show an application of the phase interpolator of the embodiment of the present invention to the clock data recovery (CDR) system.

Figure 1:
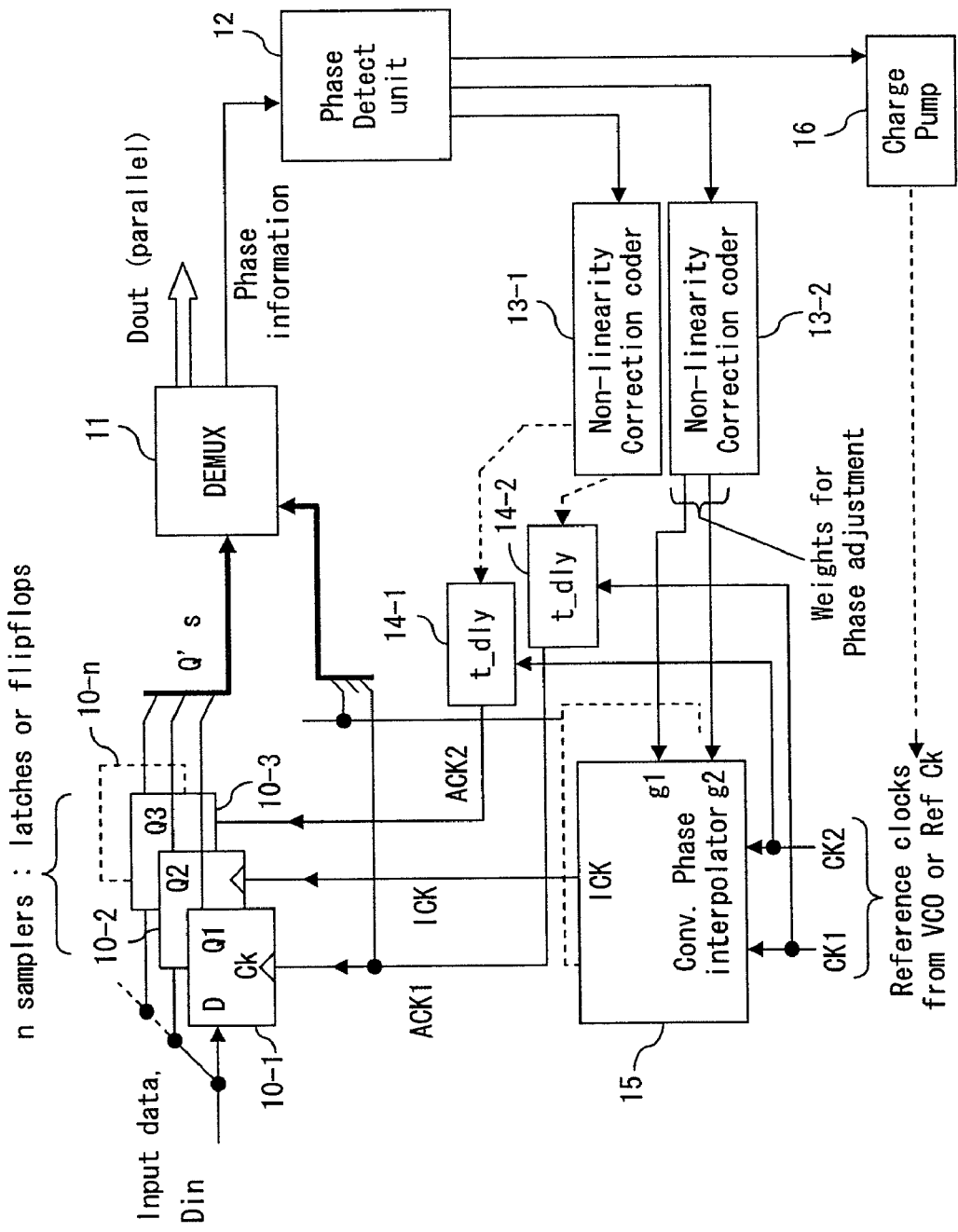
FIG. 1 shows an example of a conventional clock data recovery system.
Figure 2:
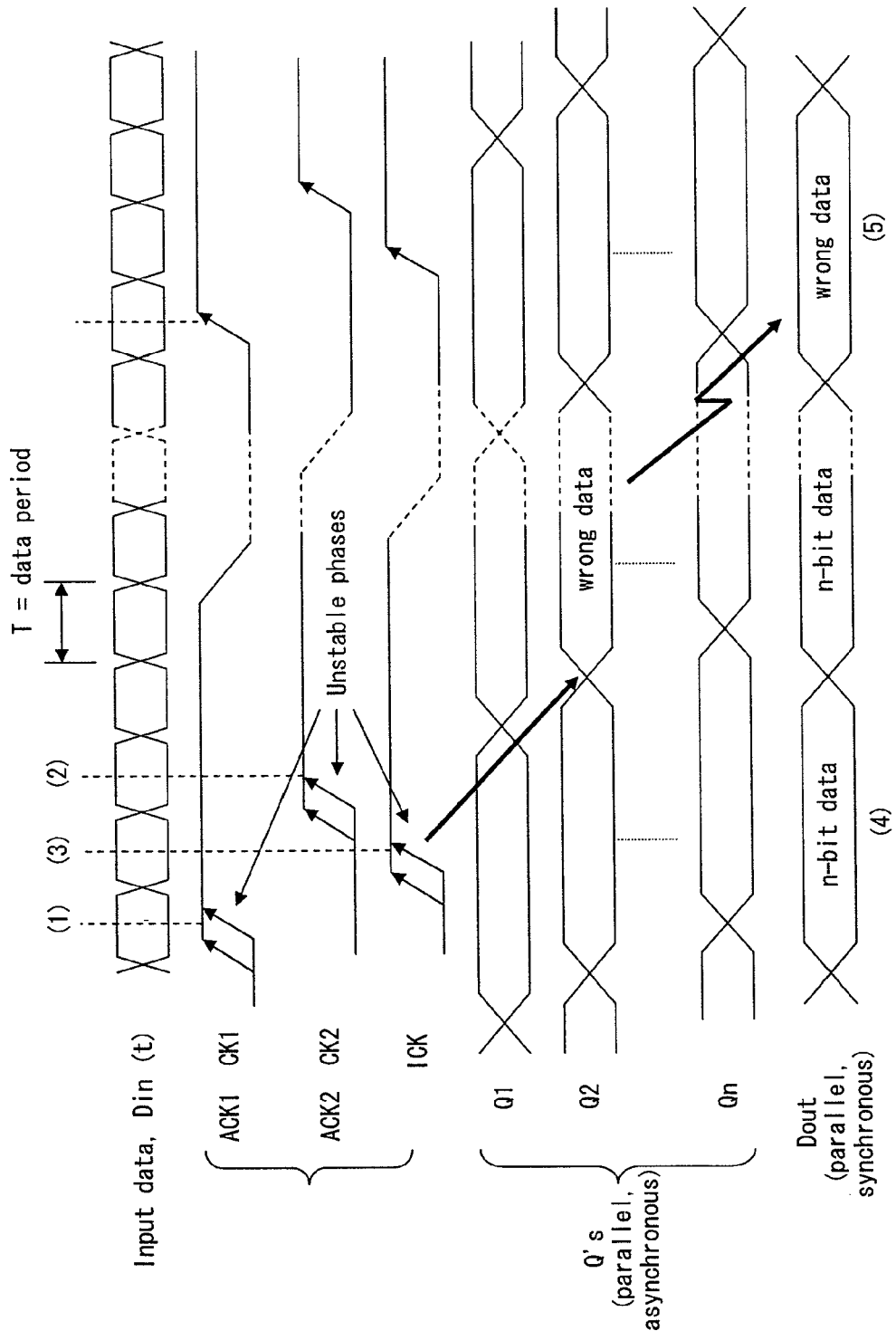
FIG. 2 shows a timing chart of the conventional data recovery system shown in FIG. 1.
Figure 3:
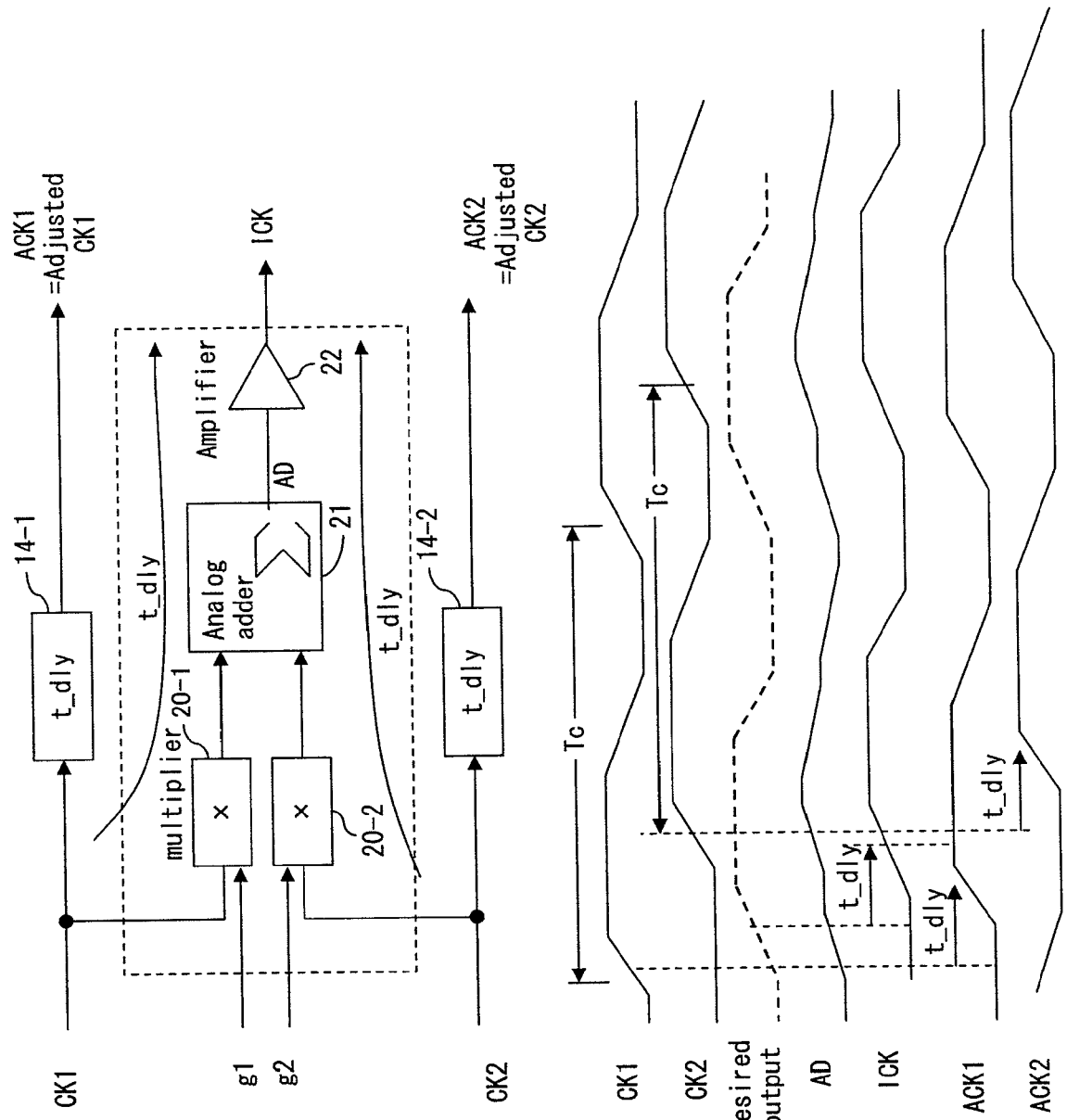
FIGS. 3A and 3B show a conventional phase interpolator used in the conventional clock data recovery system shown in FIG. 1.

In FIGS. 5A and 5B, the components similar to those of FIG. 1 are denoted by the same numerals and the explanations thereof are omitted.

Since the phase among ICK and reference clocks (CK1, CK2) are accurately aligned according to the embodiment of the present invention, the interleaved clocks can be used directly for the CDR system. The final CDR system can be simpler since the clocks from the phase interpolator 40 are finely adjusted. When a high-precision phase comparator 32 is used, the phase error can be as low as zero.

In FIG. 5A, ACK1 and ACK2 output directly from the phase interpolator 40 are used by samplers 10-1 and 10-3 as shown. Because relative phases between ACK1, ACK2 and ICK are secured by a feedback loop in the phase interpolator 40 there is no need to adjust phases of ACK1 and ACK2 based on the output of the phase detect unit 12. Also there is no need to adjust the phase of ICK by changing g1 and g2. g1 and g2 can be fixed. Therefore, delay compensation elements and non-linearity correction coders are not necessary, resulting in simpler and smaller configuration of CDR system. The output of the phase detect unit 12 is used only for control of a VCO through the charge pump 16. As shown in FIG. 5B, there is no phase instability of ACK1 and ACK2. Therefore, data error does not occur.

Figure 6A:
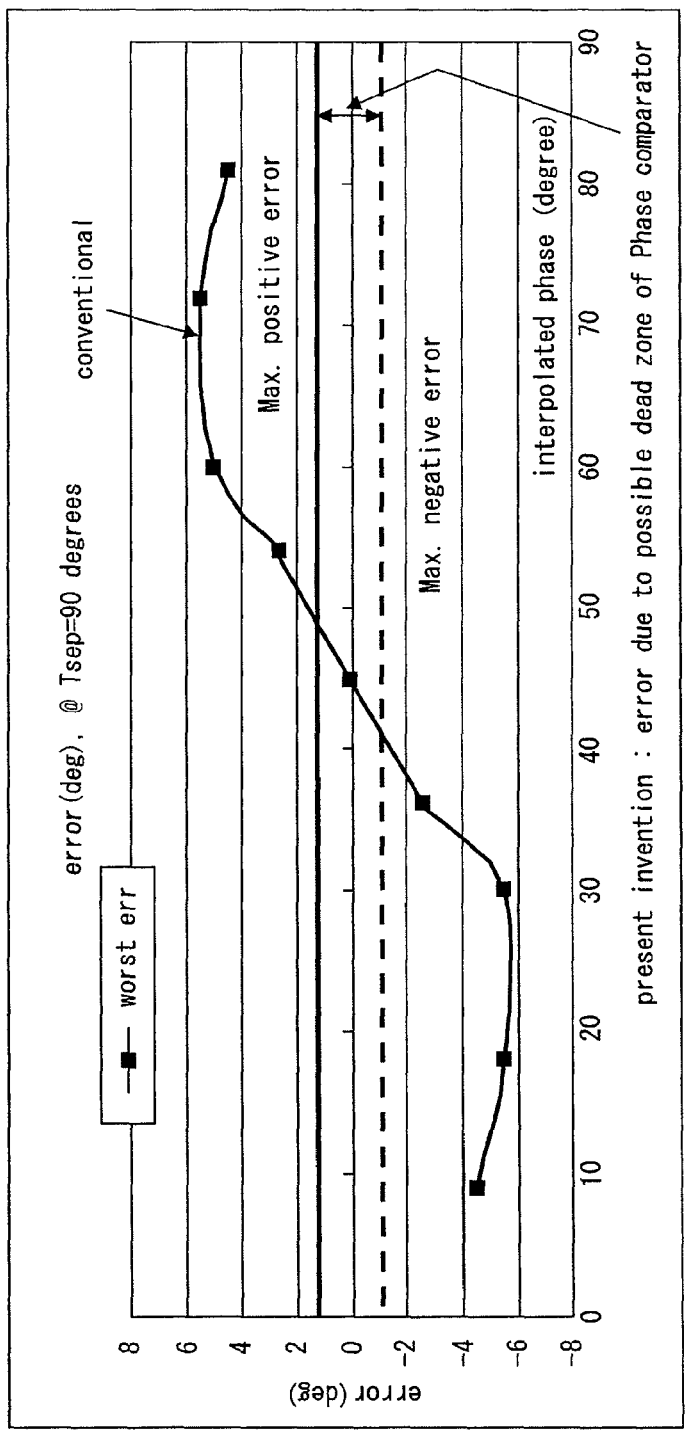
FIGS. 6A and 6B show comparison of phase characteristics of the phase interpolator of conventional technology and the embodiment of the present invention.
Figure 6B:
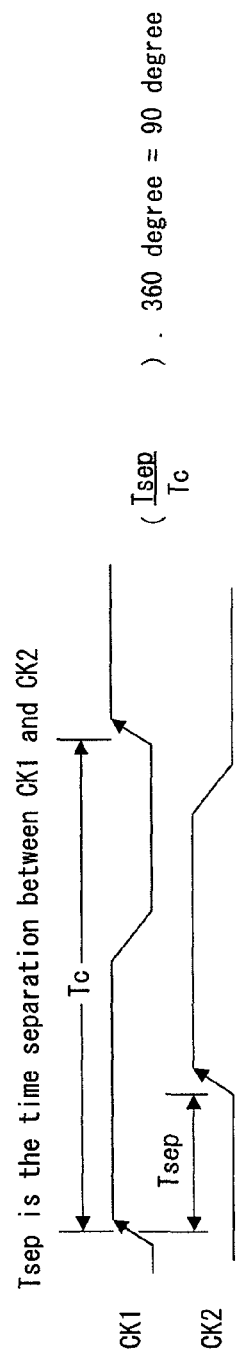

FIGS. 6A and 6B show comparison of phase characteristics of the phase interpolator of conventional technology and the embodiment of the present invention.

Values in this graph are calculated with typical transistor delays using standard 0.18 um CMOS parameters, like Berkeley Predictive Technology Model (BPTM) of the University of California at Berkeley. A time separation between CK1 and CK2, Tsep, is set to (Tc/4) such that the phase difference is 90 degrees. Please note that a clock period is expressed as 360 degrees. In this graph, Tsep/Tc*360 (degrees)=90 (degrees) are presumed as shown in FIG. 6B. In FIG. 6A, the horizontal axis indicates interpolated phase in degrees, the vertical axis indicates interpolation error in degrees and the graph shows the magnitude of interpolation error at various interpolation phases. In the conventional technology, interpolation error is about −6 degrees around 30 degrees of interpolation phase and +6 degrees around 70 degrees of interpolation phase. The conventional phase interpolator has non-linear characteristics as shown in FIG. 6A.

By using a conventional phase interpolator, the maximum phase error width is 12 degrees while the interpolated phase ranges from 0 to 90 degrees. On the other hand, the phase error of the phase interpolator of the embodiment of the present invention is automatically corrected by the internal feedback loop and can be kept as low as about ±1.3 degrees. The phase error is mainly caused by a dead zone of the phase comparator. A dead zone is a state or condition in which a phase comparator cannot determine the phase difference of the inputs. If a high-precision phase comparator is used, the phase error can be as low as zero.

FIGS. 7 and 8 show examples of voltage controlled time delays.

Figure 7A:
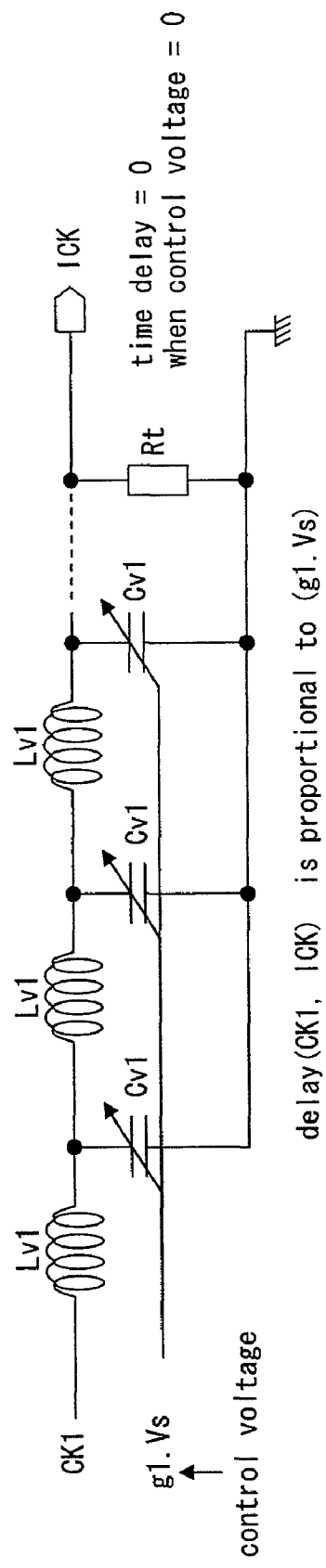
FIGS. 7A and 7B show a first example of a voltage controlled time delay.
Figure 7B:
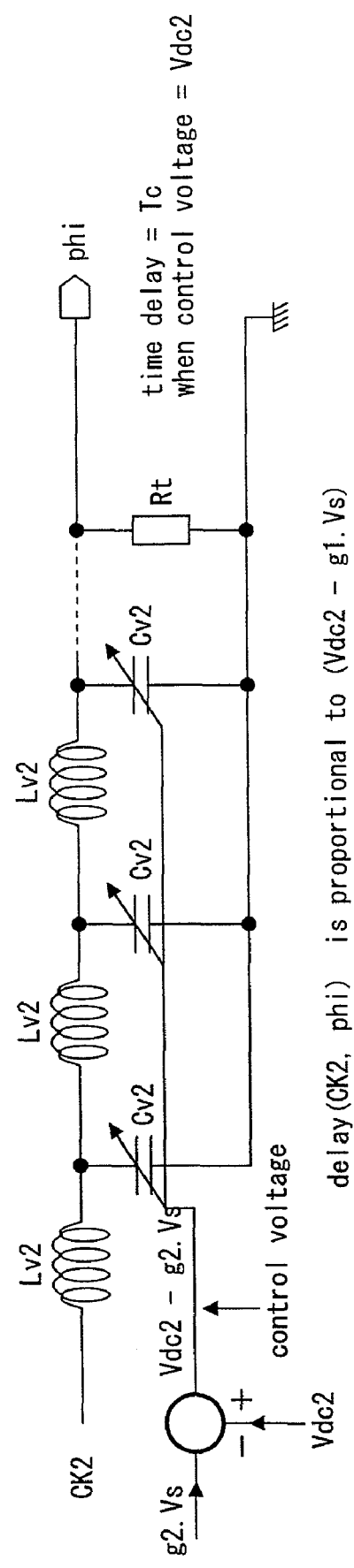

In FIGS. 7A and 7B, Lv1 and Lv2 are inductors, Cv1 and Cv2 are variable capacitors whose values are adjusted by control voltages. {g1.Vs, g2.Vs} are the voltages generated by the multipliers in the phase interpolator of the embodiment of the present invention. In FIG. 7A, g1.Vs is used as the control voltage to adjust the capacitance value "Cv1", which affects the time delay "t_dly1" between CK1 and ICK. In FIG. 7B, the control voltage is (Vdc2−g2.Vs), where Vdc2 is the control voltage at which t_dly2=Tc. Therefore, the configuration of FIG. 7A can be used for the adjustable delay 30 and that of FIG. 7B can be used for the adjustable delay 31.

FIGS. 8A and 8B show an example of an RC type voltage controlled time delay block, in which Cv1 and Cv2 are capacitors, Rv1 and Rv2 are variable resistors whose values are adjusted by control voltages. {g1.Vs, g2.Vs} are the voltage generated by the multipliers in the phase interpolator of the embodiment of the present invention. In FIG. 8A, g1.Vs is used as the control voltage to adjust the capacitance value "Rv1", which affects the time delay "t_dly1" between CK1 and ICK. In FIG. 8B, the control voltage is (Vdc2−g2.Vs), where Vdc2 is the control voltage at which t_dly2=Tc. Therefore, the configuration of FIG. 8A can be used for the adjustable delay 30 and that of FIG. 8B can be used for the adjustable delay 31.

FIGS. 9A and 9B shows an example of application of the phase interpolator of the present invention to a multi-phase clock generator.

As shown in FIG. 9A, two reference clocks (CK_0, CK_180) from e.g. VCO are inputted to four phase interpolators 45 through 48 to form a 6-phase clock generator. The clock generator outputs clocks whose phases are separated by 60 degrees to each other. Hence, the six phases are 0, 60, 120, 180, 240 and 300 degrees. The (g1, g2) values of phase interpolators 45, 46, 47, 48 are (k, 2k), (2k, k), (k, 2k), (2k, k) respectively, where k is a constant. Output ports with no connection have no output lines. As shown in FIG. 9B, CK_0 and CK_180 are used unchanged. CK_60, CK_120, CK_240 and CK_300 are generated by the multi-phase clock generator.

This multi-phase clock generator can be used to generate interleaving (or pipeline) clocks for CDR systems, transceiver and communication systems. The number of phases of clocks generated by the multi phase clock generator is not limited to 6 but can be any number without departing from the principle of the present invention.

Figure 10A:
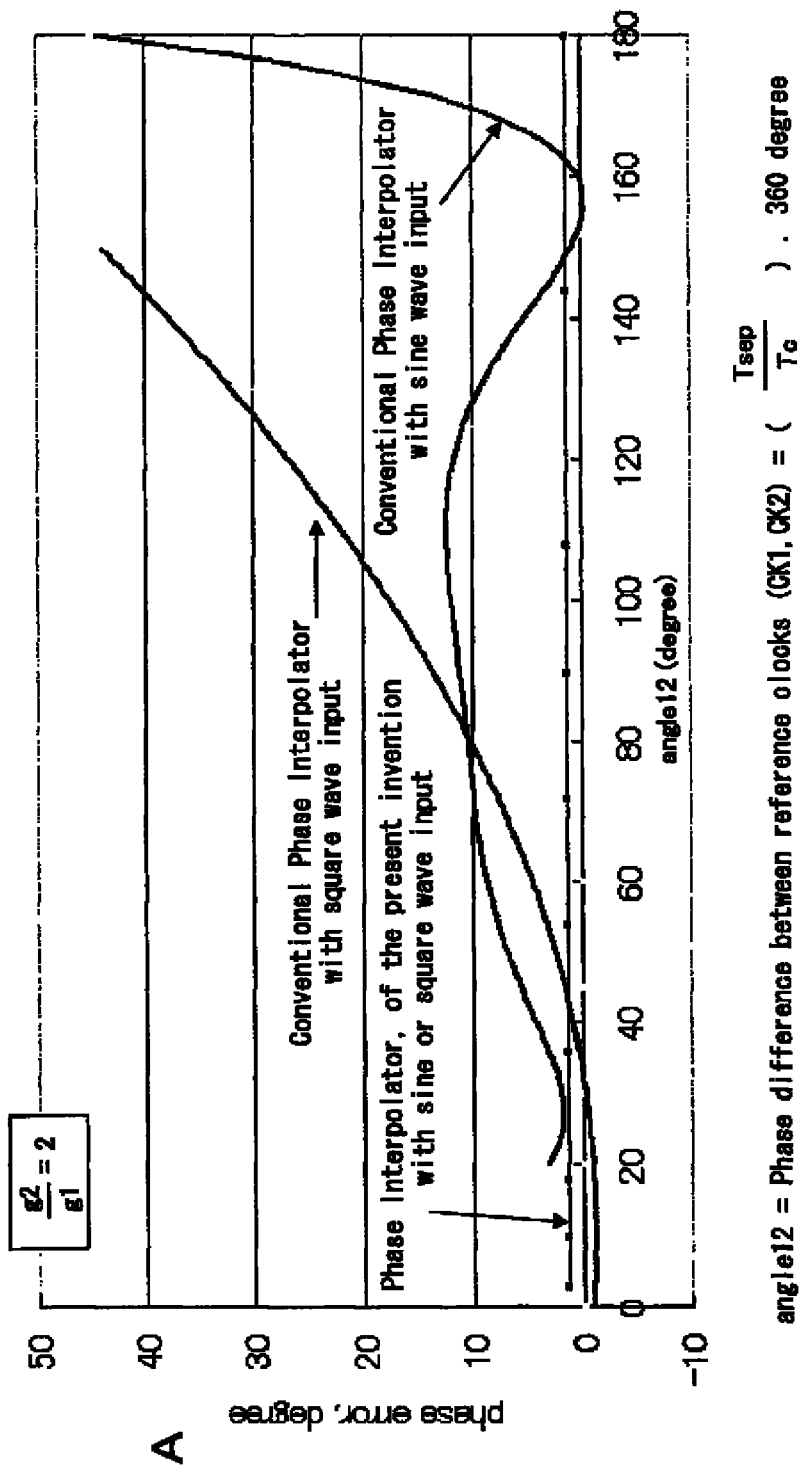
FIGS. 10A and 10B show the relationship between the phase error and the phase difference between CK1 and CK2.
Figure 10B:
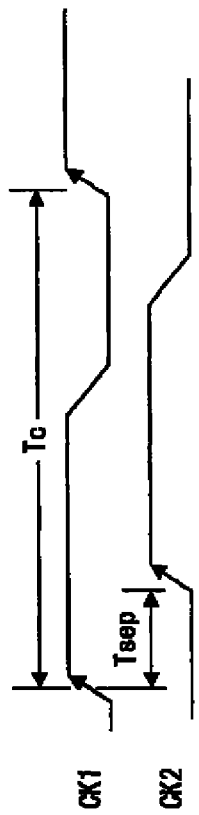

FIGS. 10A and 10B show relations between the phases of CK1 and CK2 and phase error.

Like FIG. 6A, in FIG. 10A, values in this graph are calculated with typical transistor delays using standard 0.18 um CMOS parameters. This plot describes the difference between phase characteristics of phase interpolators of conventional technology and of the present invention. While the ratio of (g2/g1) is fixed at 2, as in the case of phase interpolator 45 and 47 in FIGS. 9A and 9B, the phase error of the interpolated clock (ICK) in a conventional phase interpolator depends on (1) the waveform of the input to the phase interpolators and (2) "angle12" which indicates the phase difference between input reference clocks (CK1, CK2). Now "angle12" is defined by (Tsep/Tc)*360 (degrees) where Tsep is that time separation between CK1 and CK2 and Tc is the cyclic time period of CK1 and CK2, as shown in FIG. 10B. When (CK1, CK2) are square waves, ICK's phase error increases with "angle12". Moreover, such error increases dramatically when "angle12" exceeds about 45 degrees.

If sinusoidal waves are inputted as (CK1, CK2) to a conventional phase interpolator, ICK's phase error is larger than 10 degrees when angle12 is within the range of 80 degrees to 125 degrees. When angle12 is close to 180 degrees, the phase error increases rapidly such that ICK is not accurate.

On the other hand, the maximum phase error of the phase interpolator of the present invention is as low as 1.5 degrees (less than 2% of 90 degrees), independent of whether sinusoidal or square waves are used as reference clocks, which demonstrates an advantage of the phase interpolator of the present invention.

Figure 11:
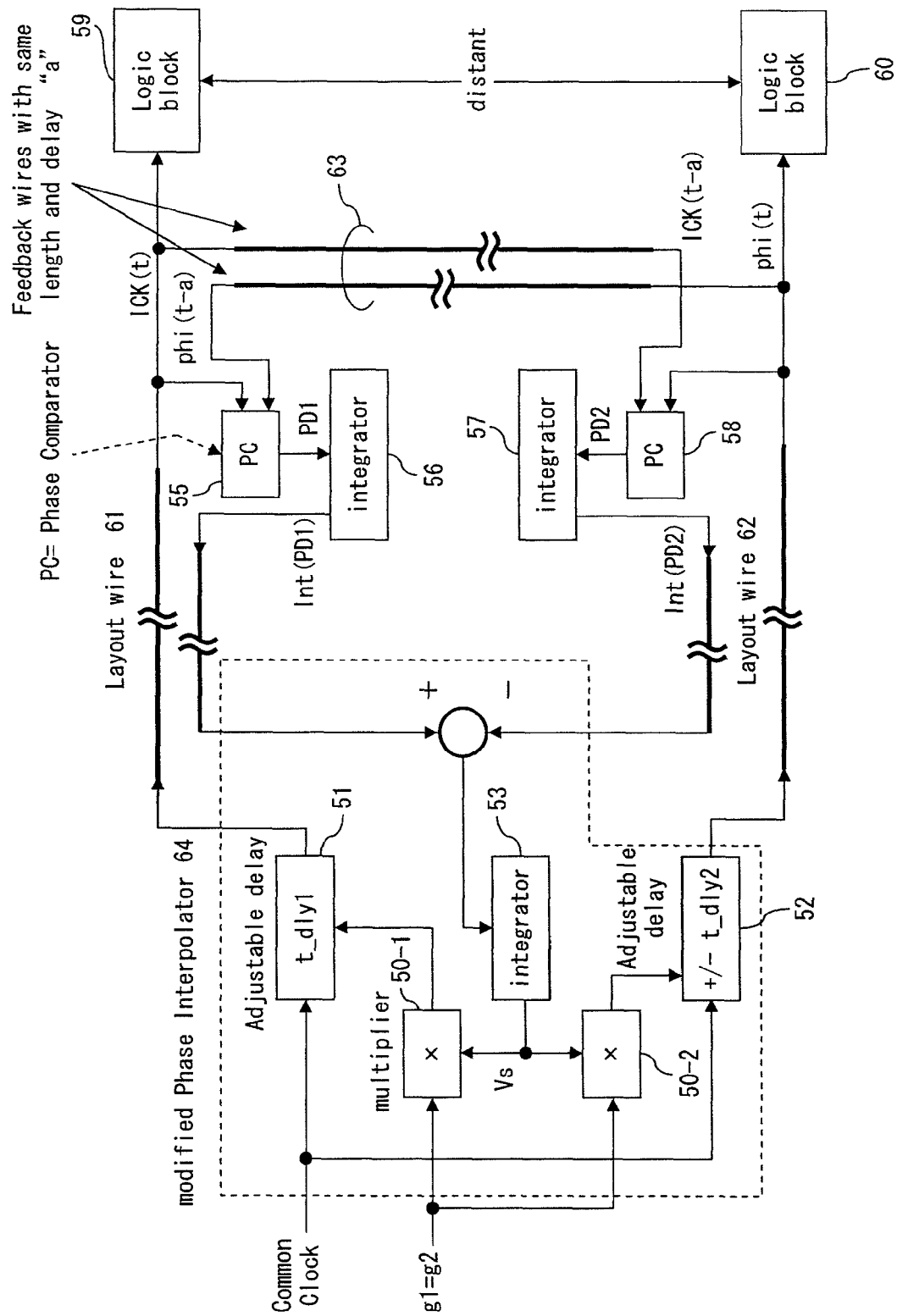
FIG. 11 shows an example of using the phase interpolator of the present invention as a clock synchronizer.

FIG. 11 shows an example of using the phase interpolator of the present invention as a clock synchronizer.

In the application of system clocks to distant parts of a large system (this system includes logic blocks 59 and 60 which operate based on clock signals and are distant from each other), it is usually difficult to synchronize these system clocks. In this example, two system clocks, ICK(t) and phi(t), are generated from the same common clock but they travel through different layout wires 61 and 62 in the system. ICK(t) passes through Layout wire 61 and phi(t) passes through Layout wire 62. Since there exists differences in delay times of those Layout wires, ICK(t) and phi(t) are not synchronized. To solve this problem, two wires of the same length and the same delay (delay amount "a") are used as feedback paths 63 to two phase comparators 55 and 58. Phases among system clocks (ICK(t) and phi(t)) and the feedback clocks (ICK(t−a) and phi(t−a)) are compared and the signals (PD1, PD2) are generated. PD1, PD2 are integrated to int(PD1) and int(PD2), respectively. Since signals int(PD1) and int(PD2) are of relatively low frequency as compared with the system clock, their values are valid even if passed through lengths equivalent to Layout wire 61 or 62. In the modified phase interpolator 64, their difference is input to integrator 53 which outputs, Vs, which is used as a control signal to adjust the phases of ICK(t) and phi(t). At the end of such an operation, the operation of the feedback loop is stabilized while ICK(t) and phi(t) are synchronized. In this case, g1 and g2 input to the multiplier 50-1 and 50-2 respectively are set to the same value. And a delay amount of the adjustable delay 52 can be positive or negative, which is denoted by "+/−", and where the "negative" delay means a delay amount of "Tc−t_dly2" where Tc is a cyclic time period of a common clock.

FIGS. 12A and 12B show a timing chart of the phase interpolator in FIG. 11.

If either ICK(t) or phi(t) are faster than the other, there will be a difference between the values of int(PD1) and int(PD2), which are the integrated signals of PD1 and PD2 respectively, as shown in PD1 part and PD2 part of FIG. 12A as a horizontal dotted line. Such a difference changes the value of Vs such that a phase difference between ICK(t) and phi(t) is decreased until (int(PD1)−int(PD2)) tends to zero. Eventually, the phase control loop will be stabilized while ICK(t) and phi(t) are synchronized as shown in FIG. 12B.

FIGS. 13A and 13B show another embodiment of the phase interpolator of the present invention.

The basic elements in FIGS. 13A and 13B are the same as those of FIG. 4. Therefore, the common elements are denoted by the same numerals as those of FIG. 4 and the explanations thereof are omitted.

The phase comparator 32 in FIG. 13A compares phases of CK2 and ph2, instead of those of ICK and phi. "ph2" is the CK1 clock signal which is delayed twice, once by the adjustable delay 30a, and once by the adjustable delay 31a. The sum of the delay amount t_dly1 of the adjustable delay 30a and the delay amount t_dly2 of the adjustable delay 31a is maintained at Tsep which is the time separation between CK1 and CK2. In this embodiment, the adjustable delay 31a delays the output of the adjustable delay 30a by a positive amount and not a negative amount.

The main advantage of this configuration is that delay value in the adjustable delay 31a is simply "t_dly2", and not "Tc-t dly2" as described in the first embodiment. Note that the same time delay circuit can be used for both adjustable delay 30a and adjustable delay 31a, as in the example structure shown in FIG. 7A or FIG. 8A.

The phase interpolator of the present invention is applicable to clock data recovery (CDR) systems, high speed transceivers, and wire line communication systems. The phase interpolator can be built on any form of Large Scale Integrated (LSI) circuit or Printed Circuit Board (PCB) or a combination of both. It can be used to build a multi-phase clock generator, as described in FIGS. 9A and 9B. It can also be used to synchronize system clocks in remote parts of a system, as shown in FIG. 11.

In the embodiments of the present invention, the feedback loop in the phase interpolator automatically adjusts phases among (CK1, CK2) and ICK. The phase relation between input reference clocks and the output clock is monitored by a phase control circuit which contains two adjustable delays, a phase comparator and an integrator. At steady state, the phase control circuit (also known as a phase feedback circuit) keeps $(t\_dly2/t\_dly1)=(g2/g1)$. Reference clocks (CK1 and CK2) can be directly used as the output clocks or interleaving clocks. The real output of ICK is usable as the desired one. The phase error characteristics of ICK are independent of the value of Tsep, g1 or g2. As a result, non-linearity correction coders can be eliminated from the CDR system. Once phases among (CK1, CK2) and ICK are determined, constant (g1, g2) can be used. The above simplifies the whole architecture of the CDR system. Phase error is independent of the value of the interpolated phase. Thus, the phase characteristic of the phase interpolator is stable. When used to adjust system clocks for remote elements in a system, the phase control circuit keeps those system clocks synchronous. Even though there are also delays in elements such as a phase comparator and multipliers, in the state in which the ICK is stabilized, only the delay value of "t_dly1" will be imposed on ICK. Moreover, none of those delays will affect CK1 or CK2. In other words, the delays of the phase comparator and multipliers do not affect the final quality of the output clocks {CK1, ICK, CK2}. In the Data Recovery System, all of {ACK1, ICK, ACK2} are used as time references to recover data from the serial input data "Din". In a conventional phase interpolator, {CK1, CK2} do not have the appropriate phase relation with ICK so that delay elements are inserted to produce {ACK1, ACK2}. However, using the phase interpolator of the present invention, the phase relation among all of {ACK1, ICK, ACK2} is automatically adjusted and correction of {CK1, CK2} is not necessary.

What is claimed is:

1. A clock synchronizer, comprising:
   a first adjustable delay unit delaying a common clock by a first delay amount;
   a second adjustable delay unit delaying the common clock by a second delay amount;
   propagation paths comprising a path which propagates output of the first adjustable delay unit and a path which propagates output of the second adjustable delay unit;
   feedback paths comprising a first path which feeds back the propagated output of the first adjustable delay unit and a second path which feeds back the propagated output of the second adjustable delay unit, the first path and the second path having an equal delay amount;
   a difference signal generating unit generating a difference signal obtained by comparing a phase difference between the propagated output of the first adjustable delay unit and a fed back output of the second adjustable delay unit with a phase difference between the propagated output of the second adjustable delay unit and a fed back output of the first adjustable delay unit; and
   a control unit controlling the first delay amount and the second delay amount to decrease the difference signal.

* * * * *